(12) United States Patent
Lin et al.

(10) Patent No.: US 8,178,923 B2
(45) Date of Patent: May 15, 2012

(54) POWER SEMICONDUCTOR DEVICE HAVING LOW GATE INPUT RESISTANCE

(75) Inventors: Wei-Chieh Lin, Hsinchu (TW); Guo-Liang Yang, Hsinchu (TW); Jia-Fu Lin, Yilan County (TW); Shian-Hau Liao, Taichung (TW)

(73) Assignee: Sinopower Semiconductor Inc., Hsinchu Science Park, Hsinchu (TW)

( * ) Notice: Subject to any disclaimer, the term of this patent is extended or adjusted under 35 U.S.C. 154(b) by 92 days.

(21) Appl. No.: 12/840,283

(22) Filed: Jul. 20, 2010

(65) Prior Publication Data

US 2011/0291183 A1    Dec. 1, 2011

(30) Foreign Application Priority Data

May 27, 2010    (TW) ................................ 99116982 A

(51) Int. Cl.
*H01L 23/48* (2006.01)

(52) U.S. Cl. .. 257/330; 257/341; 257/773; 257/E29.262

(58) Field of Classification Search .................. 257/302, 257/328, 330, 341, 773–776, E29.262, E21.41; 438/270

See application file for complete search history.

(56) References Cited

U.S. PATENT DOCUMENTS

| | | | |
|---|---|---|---|
| 6,215,149 B1 | 4/2001 | Lee | |
| 6,620,669 B2 | 9/2003 | Hijzen | |
| 6,620,691 B2 | 9/2003 | Hshieh | |
| 6,737,323 B2 * | 5/2004 | Mo | ................................ 438/270 |
| 6,838,722 B2 | 1/2005 | Bhalla | |
| 2011/0291183 A1 * | 12/2011 | Lin et al. | ........................ 257/330 |

* cited by examiner

*Primary Examiner* — Jack Chen
(74) *Attorney, Agent, or Firm* — Winston Hsu; Scott Margo

(57) ABSTRACT

A power semiconductor device having low gate input resistance and a manufacturing method thereof are provided. The power semiconductor device includes a substrate, at least a trench transistor, a conductive layer, a metal contact plug, an insulating layer, an interlayer dielectric, a gate metal layer, and a source metal layer. The metal contact plug can serve as a buried gate metal bus line, and the metal contact plug can pass under the source metal layer and keeps the area of the source metal layer complete. Accordingly, the present invention can provide a lower gate input resistance without dividing the source metal layer, so the source metal layer can have a larger and complete area for the following packaging and bonding process.

6 Claims, 6 Drawing Sheets

POWER SEMICONDUCTOR DEVICE HAVING LOW GATE INPUT RESISTANCE

BACKGROUND OF THE INVENTION

1. Field of the Invention

The present invention relates to a power semiconductor device and a manufacturing method thereof, and more particularly, to a power semiconductor device having low gate input resistance and a manufacturing method thereof.

2. Description of the Prior Art

In the trench transistor, a gate electrode is disposed in a trench of a substrate, and a source electrode and a drain electrode are respectively disposed at an upper side and a lower side of the gate electrode. A channel is vertically formed between the source electrode and the drain electrode. Accordingly, some advantages are provided by this structure, such as a high voltage-withstand ability, low on-resistance, and a large current. As a result, the trench transistors are widely applied in power management, such as switching power supplies, integrated circuits used in power management, backlight power supplies, and motor controllers.

Generally, the trench transistor is operated with a large current. In order to reduce the power loss, a gate metal bus line is disposed to provide an additional input path of a gate voltage for improving the gate input resistance. Please refer to FIG. 1, which schematically illustrates a layout of a power semiconductor device in the prior art. To simplify the description, only some elements are shown in FIG. 1. As shown in FIG. 1, two segments of the source metal layer 11 and one gate metal layer 12 are disposed on a substrate 10, and trench transistors (not shown in the figure) are disposed under each of the source metal layers 11. The source metal layer 11 is configured to provide a source voltage to a source electrode of the trench transistor, and the gate metal layer 12 is configured to provide a gate voltage to a gate electrode of the trench transistor. Furthermore, the gate metal layer 12 has a gate metal bus line 13 for decreasing the gate input resistance.

However, in order to reduce the gate input resistance, an additional area is required for disposing the gate metal bus line 13 in the power semiconductor device of the prior art. Accordingly, the gate metal bus line 13 divides the source metal layer 11 into two segments, and the gate metal bus line 13 can transmit the gate voltage to the gate electrodes of the trench transistors under each of the source metal layers 11. Therefore, the area of each segment of the source metal layer 11 is reduced, and it increases manufacturing costs and difficulty in the subsequent bonding and packaging processes. Moreover, an additional space is required to isolate the gate metal bus line 13 and the source metal layer 11, and it further reduces the bonding area and decreases the integration degree. As a result, an improvement of the power semiconductor device in the prior art is necessary to reduce the gate input resistance and to keep the entire source metal layer 11 complete.

SUMMARY OF THE INVENTION

It is therefore one of the objectives of the present invention to provide a power semiconductor device having low gate input resistance and a manufacturing method thereof to solve the problem in the prior art.

According to a preferred embodiment of the present invention, a power semiconductor device having low gate input resistance is provided. The power semiconductor device includes a substrate, at least a trench transistor, a conductive layer, a metal contact plug, an insulating layer, an interlayer dielectric, and a patterned metal layer. The substrate has an active region and a gate metal region, and the substrate in the active region has at least a gate bus trench and a plurality of cell trenches, wherein the gate bus trench extends to the gate metal region, and the cell trenches and the gate bus trench are connected to each other. The trench transistor is disposed in the active region of the substrate and at a side of the gate bus trench. The conductive layer and a metal contact plug are disposed in the gate bus trench. The insulating layer and the interlayer dielectric are disposed on the substrate, wherein the insulating layer completely covers the metal contact plug in the active region, the insulating layer covers a portion of the gate metal region to expose a portion of the metal contact plug in the gate metal region, and the interlayer dielectric covers the conductive layer. Moreover, the patterned metal layer is disposed on the interlayer dielectric and the insulating layer, wherein the patterned metal layer comprises a gate metal layer and a source metal layer respectively disposed on the gate metal region and the active region. The gate metal layer is electrically connected to the metal contact plug for being configured to provide a gate voltage, and the source metal layer covers the insulating layer and is electrically connected to the trench transistor for being configured to provide a source voltage.

According to a preferred embodiment of the present invention, a manufacturing method of a power semiconductor device having low gate input resistance is provided. The manufacturing method includes the following steps. First, a substrate is provided. The substrate has an active region and a gate metal region, and the substrate in the active region has at least a gate bus trench and a plurality of cell trenches, wherein the gate bus trench extends to the gate metal region, and the cell trenches and the gate bus trench are connected to each other. Then, a conductive layer is formed in the bus gate trench, and an interlayer dielectric is formed to cover the conductive layer. Subsequently, a metal contact plug is formed in the interlayer dielectric and in the substrate, wherein the metal contact plug is disposed in the gate bus trench and extends from the active region to the gate metal region. Following that, a portion of the metal contact plug is etched to form a groove, wherein the groove extends to the gate metal region. Furthermore, an insulating layer is filled into the groove to completely cover the metal contact plug in the active region. Subsequently, a patterned metal layer is formed on the insulating layer and the interlayer dielectric, wherein the patterned metal layer comprises a gate metal layer and a source metal layer respectively disposed on the gate metal region and the active region, the gate metal layer is electrically connected to the metal contact plug, and the source metal layer covers the insulating layer.

The power semiconductor device of the present invention has the metal contact plug, and the metal contact plug can serve as a gate metal bus line. More specifically, the metal contact plug of the present invention passes the active region under the source metal layer to keep the area of the source metal layer complete. Compared to the prior art, the metal contact plug of the present invention can be disposed in the active region to have low gate input resistance and without dividing the source metal layer into segments, so that the source metal layer can have a larger and complete area for the subsequent bonding and packaging processes. In addition, only some steps are added in the conventional manufacturing method to achieve the power semiconductor device having low gate input resistance in the present invention, so that it is compatible with the existing manufacturing processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5A to FIG. 7B are schematic cross-sectional views illustrating a manufacturing method of the power semiconductor device according to the first preferred embodiment of the present invention.

DETAILED DESCRIPTION

In the following specifications and claims, certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". Also, the term "electrically connect" is intended to mean either an indirect or direct electrical connection. Accordingly, if one device is coupled to another device, that connection may be through a direct electrical connection, or through an indirect electrical connection via other devices and connections.

Figure 1:
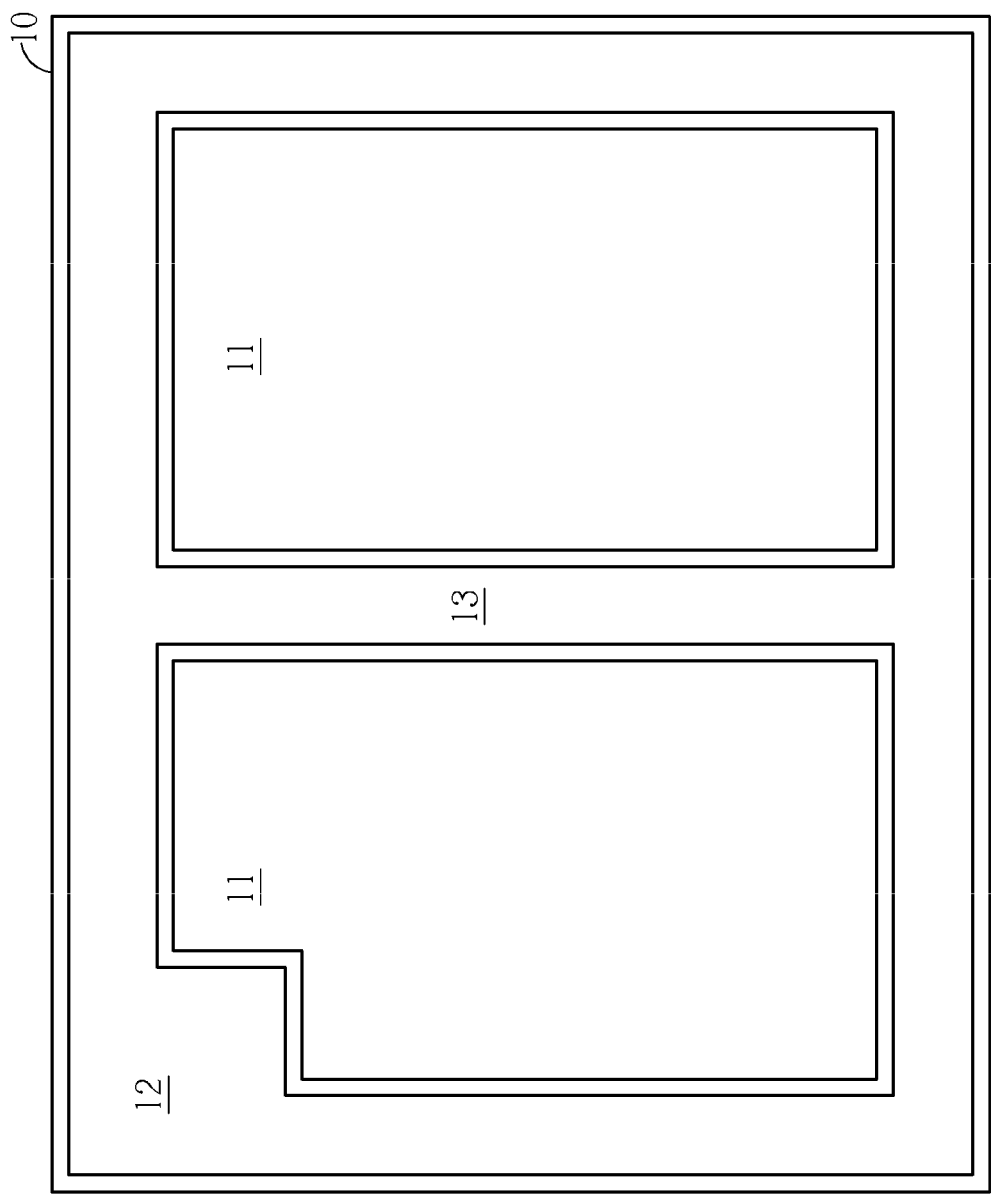
FIG. 1 schematically illustrates a layout of a power semiconductor device in the prior art.
Figure 2:
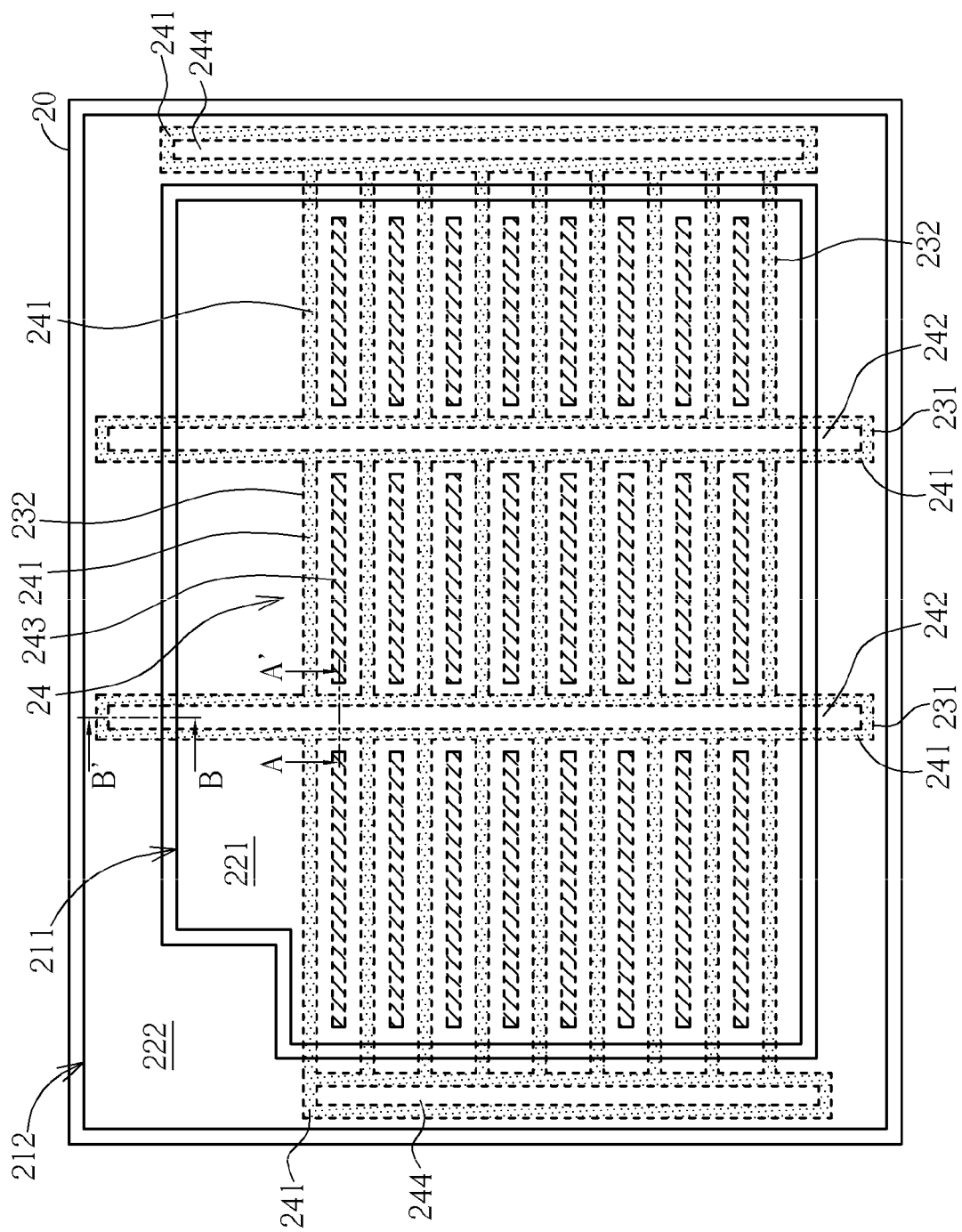
FIG. 2 schematically illustrates a layout of a power semiconductor device according to a first preferred embodiment of the present invention.

Please refer to FIG. 2, which schematically illustrates a layout of a power semiconductor device according to a first preferred embodiment of the present invention. In order to simplify the description, FIG. 2 only illustrates some elements and does not show all of the elements. As shown in FIG. 2, an active region 211 and a gate metal region 212 are defined on the upper surface of the substrate 20. In the present preferred embodiment, the gate metal region 212 surrounds the active region 211, but it is not limited herein. For example, the gate metal region 212 may be disposed at a side of the active region 211. Also, a patterned metal layer is on the substrate 20, and the patterned metal layer includes a source metal layer 221 and a gate metal layer 222. The source metal layer 221 is disposed in the active region 211, and the gate metal layer 222 is disposed on the gate metal region 212. Furthermore, the substrate 20 in the active region 211 has at least a gate bus trench 231 and a plurality of the cell trenches 232. The gate bus trench 231 passes the active region 211 and extends to the gate metal region 212, and the cell trenches 232 are connected to the gate bus trench 231 at a particular angle, such as 90 degrees. In addition, at least a trench transistor 24 is disposed in the substrate 20 of the active region 211 and at a side of the gate bus trench 231. As shown in FIG. 2, pluralities of the trench transistors 24 are disposed at two sides of the gate bus trench 231. The gate bus trench 231 is configured to accommodate a bus line, and the cell trench 232 is configured to accommodate a gate electrode of the trench transistor 24.

Figure 3:
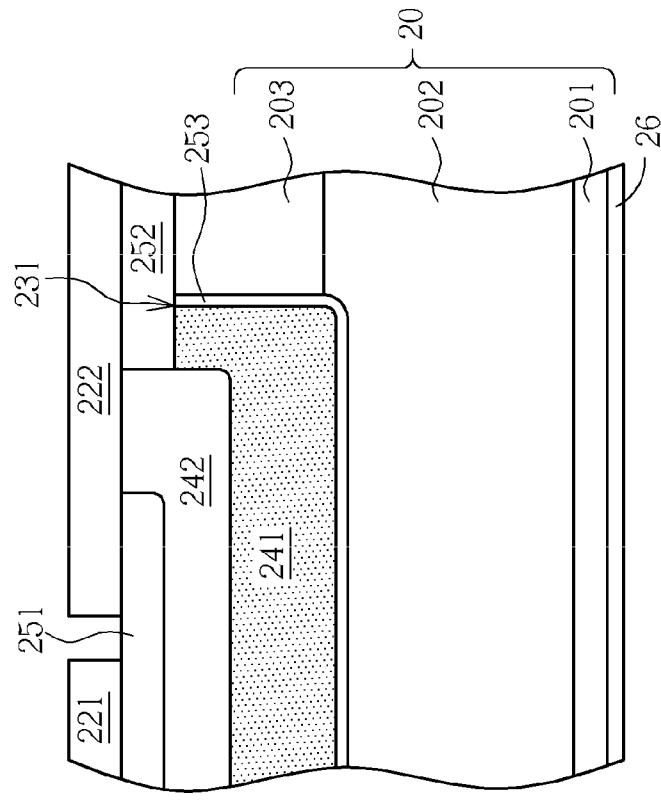
FIG. 3 is a schematic cross-sectional view of FIG. 2 along a line A-A'.
Figure 4:
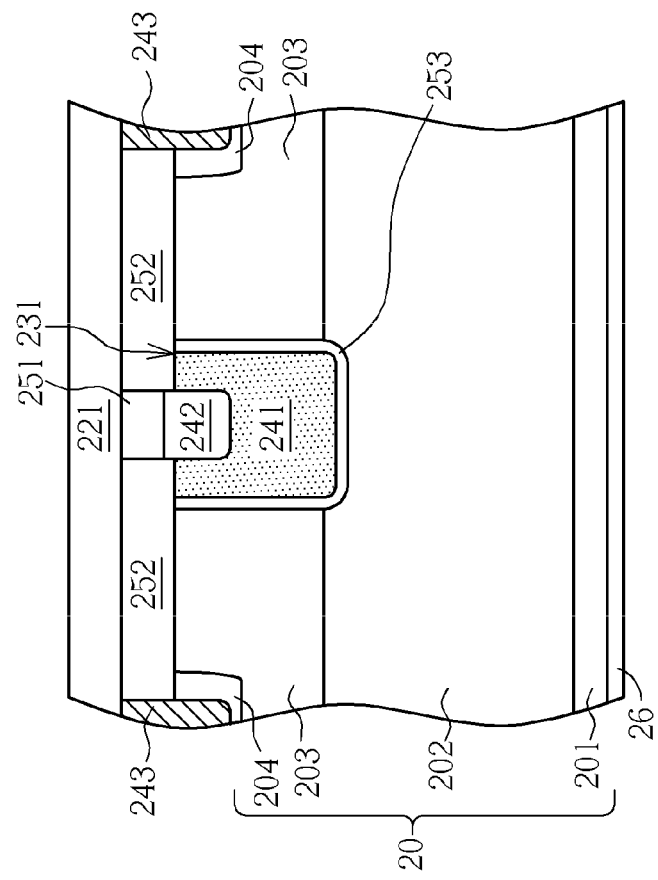
FIG. 4 is a schematic cross-sectional view of FIG. 2 along a line B-B'.

Please refer to FIG. 2 to FIG. 4. FIG. 3 is a schematic cross-sectional view of FIG. 2 along a line A-A', and FIG. 4 is a schematic cross-sectional view of FIG. 2 along a line B-B'.

As shown in FIGS. 2-4, in the present preferred embodiment, a conductive layer 241 and a metal contact plug 242 are disposed in the gate bus trench 231, and the conductive layer 241 is also disposed in the cell trenches 232. Accordingly, a bus line is formed by the metal contact plug 242 and the conductive layer 241 in the gate bus trench 231, and a gate of the trench transistor 24 is formed by the conductive layer 241 in the cell trenches 232. The material of the metal contact plug 242 may be a metal material such as tungsten, but it is not limited herein and may be other appropriate conductive materials with superior hole-filling ability and low resistance according to the process requirements and the width of the trench. The material of the conductive layer 241 may be doped polysilicon, but it is not limited herein and may also be other appropriate conductive materials according to the process requirements and the width of the trench. Moreover, an insulating layer 251 is disposed on the gate bus trench 231 of the substrate 20. The insulating layer 251 completely covers the metal contact plug 242 in the gate bus trench 231 of the active region 211, and the insulating layer 251 covers a portion of the gate metal region 212 to expose a portion of the metal contact plug 242 in the gate metal region 212. An interlayer dielectric 252 is disposed on the substrate 20, and the interlayer dielectric 252 covers the conductive layer 241 in the gate bus trench 231 and the cell trenches 232. Accordingly, the metal contact plug 242 in the gate bus trench 231 can be electrically connected to the gate metal layer 222 in the gate metal region 212, and the metal contact plug 242 in the active region 211 can be electrically isolated from the source metal layer 221 in the active region 211 with the aid of the insulating layer 251. Furthermore, a gate voltage provided from the gate metal layer 222 can be transmitted to the gate of the trench transistor 24 in the cell trench 232 through the metal contact plug 242 under the source metal layer 221. In other words, the metal contact plug 242 of the present preferred embodiment can serve as a buried gate metal bus line which passes the active region 211 under the source metal layer 221 to keep the area of the source metal layer 221 complete. Compared to the prior art, the metal contact plug 242 of the present preferred embodiment can be disposed in the active region 211 to have low gate input resistance and without dividing the source metal layer 221 into segments, so that the source metal layer 221 can have a larger and complete area for the subsequent bonding and packaging processes. Moreover, since the metal contact plug 242 is buried, a plurality of the metal contact plugs 242 can be disposed in the active region 211 to decrease the gate input resistance and to increase the number of the trench transistor 24 without influencing the area of the source metal layer 221.

In the present preferred embodiment, the width of the gate bus trench 231 is preferably larger than that of the cell trenches 232. Accordingly, the metal contact plug 242 can be disposed in the gate bus trench 231 to improve the gate input resistance. In addition, the power semiconductor device of the present preferred embodiment further includes at least a source contact plug 243. For example, a plurality of the source contact plug 243 may be disposed in the active region 211 and respectively disposed between two adjacent cell trenches 232. Therefore, a source voltage provided by the source metal layer 221 can be transmitted to a source electrode of the trench transistor 24 through the source contact plug 243. Moreover, the power semiconductor device of the present preferred embodiment further includes a drain metal layer 26 which is disposed on a surface of the substrate 20 opposite to the patterned metal layer, i.e. on the lower surface of the substrate 20. Thus, the conductive layer 241 disposed in the cell trenches 232 serves as a gate electrode of the trench transistor 24, the source contact plug 243 serves as a source contact plug of the trench transistor 24, and the drain metal layer 26 serves as a drain electrode of the trench transistor 24. In addition, since the gate metal region 212 of the present preferred embodiment surrounds the active region 211, two gate contact plugs 244 can be disposed in the gate metal region 212 and respectively at two sides of the active region 211, and the gate contact plugs 244 are electrically connected to the conductive layer 241 and the gate metal layer 222 in the cell trenches 232 for providing a gate voltage.

In the manufacturing method of the power semiconductor device according to a preferred embodiment of the present invention, some steps are added to achieve the power semiconductor device with the buried gate metal bus line compared to the manufacturing method of the power semiconductor device in the prior art. To provide a better understanding of the presented invention, the following description mainly focuses on the added steps.

Figures 5A, 5B:
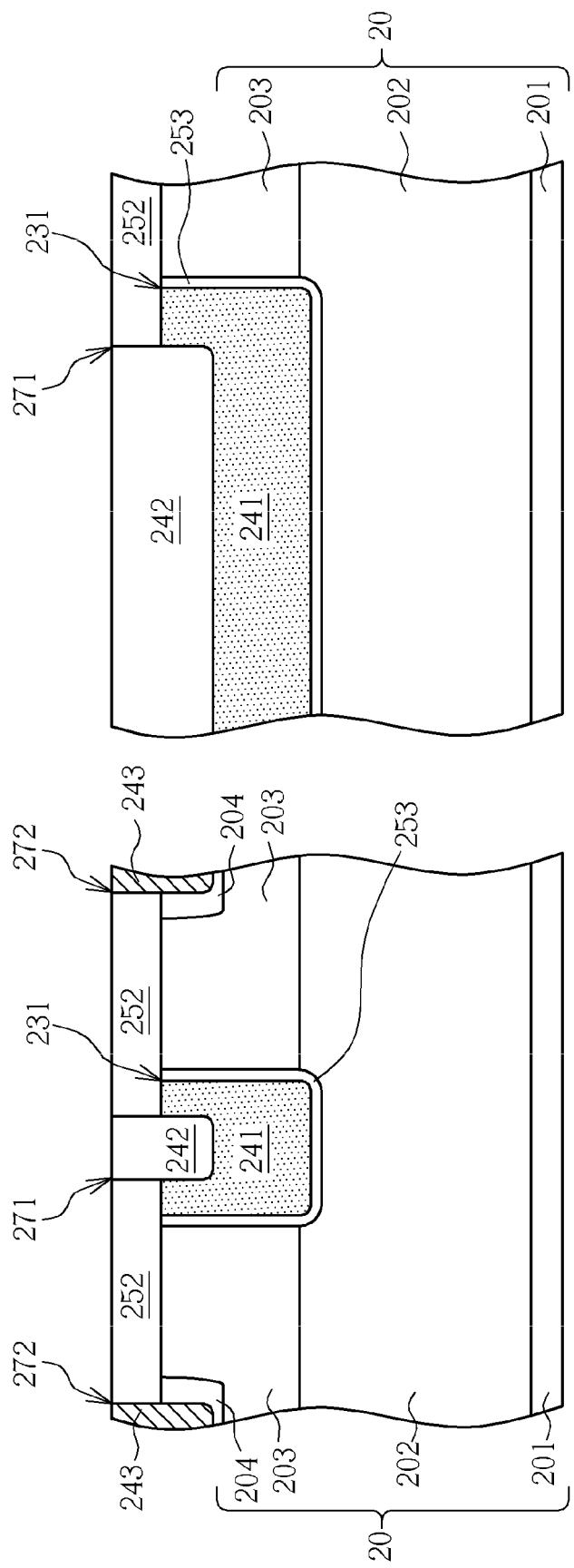
Figures 6A, 6B:
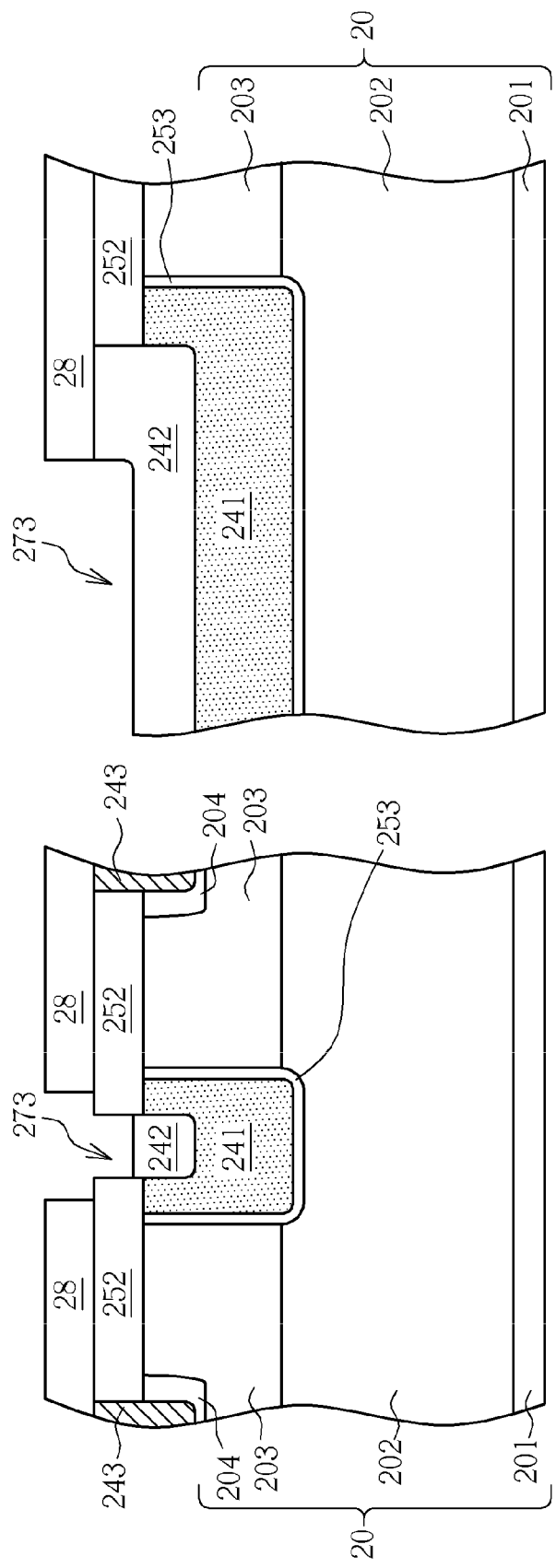
Figures 7A, 7B:
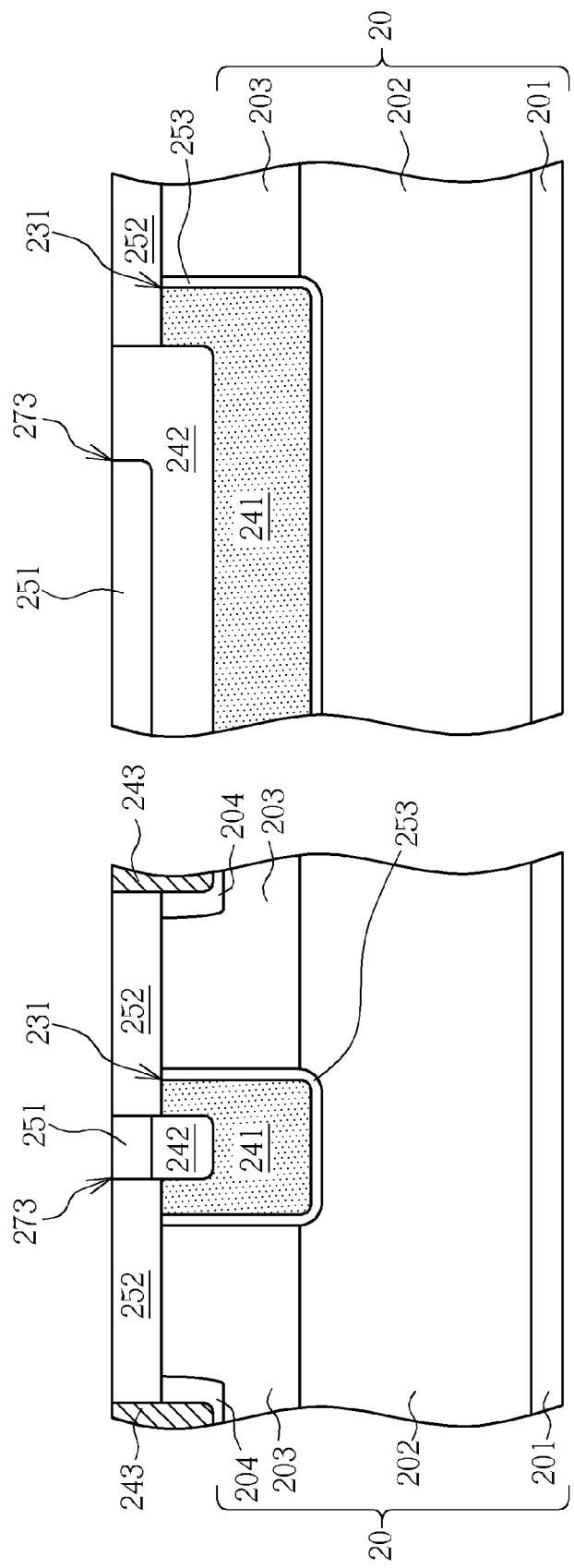

Please refer to FIG. 5A to FIG. 7B, which are schematic cross-sectional views illustrating the manufacturing method of the power semiconductor device according to the first preferred embodiment of the present invention. FIG. 5A, FIG. 6A and FIG. 7A are schematic cross-sectional views of FIG. 2 along a line A-A', and FIG. 5B, FIG. 6B and FIG. 7B are schematic cross-sectional views of FIG. 2 along a line B-B'. As shown in FIG. 5A and FIG. 5B, a substrate 20 is provided. Please additionally refer to FIG. 2. Then, the gate bus trench 231 and a plurality of the cell trenches 232 are formed in the active region 211 and the gate metal region 212 of substrate 20. Subsequently, a gate insulating layer 253 is formed on a surface of the gate bus trench 231 and the cell trenches 232. Following that, a conductive layer 241 is formed in the gate bus trench 231 and the cell trenches 232. Finally, an interlayer dielectric 252 is formed to completely cover the substrate 20 and the conductive layer 241. The aforementioned processes are known to those skilled in the art and not redundantly given. In addition, the substrate 20 of the present preferred embodiment has a heavily doped substrate layer 201, a lightly doped epitaxial layer 202, a lightly doped body region 203 and a heavily doped body region 204. The heavily doped substrate layer 201 and the lightly doped epitaxial layer have a first conductivity type, and the lightly doped body region 203 and the heavily doped body region 204 have a second conductivity type which is different from the first conductivity type. For example, in the present preferred embodiment, the first conductivity type is n-type and the second conductivity type is p-type, but it is not limited herein. The manufacturing processes of each doped region are known to those skilled in the art and not redundantly given.

As shown in FIG. 5A and FIG. 5B, a metal contact plug 242 and a plurality of the source contact plugs 243 are then formed in the interlayer dielectric 252 and the substrate 20. The method of forming the metal contact plug 242 and the source contact plug 243 includes the following steps. First, a photo-etching process (PEP) is performed to form at least a first contact hole 271 and a plurality of the second contact holes 272 in the interlayer dielectric 252 and substrate 20, and the first contact hole 271 and each of the second contact holes 272 respectively expose the conductive layer 241 in the gate bus trench 231 and in each of the cell trenches 232. Then, a metal contact layer (not shown in the figure) is completely formed on the substrate 20 and to fill up the first contact hole 271 and each of the second contact holes 272. The material of the metal contact layer may be a metal material such as tungsten. Subsequently, a planarization process is performed on the metal contact layer, such that the metal contact layer and the interlayer dielectric 252 have a smooth surface. The planarization process may be a chemical mechanical polishing (CMP) process, an etching process or combination thereof, but it is not limited herein. After the planarization process, the metal contact layer disposed in the first contact hole 271 is the metal contact plug 242, and the metal contact layer disposed in the second contact hole 272 is the source contact plug 243.

As shown in FIG. 6A and FIG. 6B, a mask pattern 28 is then formed on the substrate 20 which has the metal contact plug 242 and the source contact plug 243. It should be noted that the mask pattern 28 mainly exposes the entire metal contact plug 242 in the active region 211 and exposes a portion of the metal contact plug 242 in the gate metal region 212. In other words, the mask pattern 28 only exposes a portion of the metal contact plug 242 in the gate bus trench 231, and the mask pattern 28 does not expose the region having the metal material. Following that, with the aid of the mask pattern 28, a portion of the metal contact plug 242 is etched to form a groove 273. Also, the groove 273 extends to the gate metal region 212. The length of the groove 273 is smaller than the length of the metal contact plug 242, and the width of the groove 273 is equal to the width of the metal contact plug 242.

As shown in FIG. 7A and FIG. 7B, an insulating layer 251 is filled into the groove 273. The method of filling the insulating layer 251 into the groove 273 may include the following steps. First, an insulating material (not shown in the figure) is completely deposited on the substrate 20 and to fill up the groove 273. Then, a planarization process is performed on the insulating material to form the insulating layer, wherein the insulating material and the interlayer dielectric 252 have a smooth surface. After the planarization process, the insulating material disposed in the groove 273 is the insulating layer 251. In the same way, the planarization process may include a chemical mechanical polishing process, an etching process or combination thereof, but it is not limited herein. Subsequently, as shown in FIG. 3 and FIG. 4, a patterned metal layer is formed on substrate 20, and the patterned metal layer includes a source metal layer 221 and a gate metal layer 222. Finally, a drain metal layer 26 is formed on a surface of the substrate 20 opposite to the patterned metal layer, i.e. on the lower surface of the substrate 20. The power semiconductor device according to the first preferred embodiment of the present invention is finished.

It should be noted that the method of forming the metal contact plug 242 and the source contact plug 243 of the present invention is not limited to the aforementioned embodiment. More specifically, as shown in FIG. 5A, the metal contact plug 242 and the source contact plug 243 of the aforementioned embodiment are formed together and have the same material, such as tungsten. However, in another embodiment of the present invention, the metal contact plug 242 and the source contact plug 243 are not formed together. For example, in the manufacturing steps of FIG. 5A, at least a first contact hole 271 and a plurality of the second contact holes 272 may be formed together in the interlayer dielectric 252 and in substrate 20. Then, a metal contact layer (not shown in the figure) is formed on the substrate, and the metal contact layer is only filled into the first contact hole 271 and not filled into the second contact holes 272 with the aid of a mask. Subsequently, a planarization process is performed on the metal contact layer, and the metal contact layer disposed in he first contact hole 271 is the metal contact plug 242. Following that, the groove 273 and the insulating layer 251 are formed in the same way, and the source contact plug 243 and the source metal layer 221 are formed together. In other words, when forming the source metal layer 221, the material of the source metal layer 221 is filled into the second contact holes 272 to form the source contact plugs 243. In this embodiment, the material of the gate metal layer 222, the source contact plugs 243 and the source metal layer 221 may be aluminum, but it is not limited herein.

In summary, the power semiconductor device having low gate input resistance in the present invention has the metal contact plug, and the metal contact plug can serve as a gate metal bus line. More specifically, the metal contact plug of the present invention passes the active region under the source metal layer to keep the area of the source metal layer complete. Compared to the prior art, the metal contact plug of the present invention can be disposed in the active region to have low gate input resistance and without dividing the source metal layer into segments, so that the source metal layer can have a larger and complete area for the subsequent bonding and packaging processes. Moreover, since the metal contact plug is buried, a plurality of the metal contact plugs can be disposed in the active region to decrease the gate input resistance and to increase the number of the trench transistors without influencing the area of the source metal layer. In addition, only some steps are added in the conventional manufacturing method to achieve the power semiconductor device having low gate input resistance in the present invention, so that it is compatible with the existing manufacturing processes.

Those skilled in the art will readily observe that numerous modifications and alterations of the device and method may be made while retaining the teachings of the invention.

What is claimed is:

1. A power semiconductor device having low gate input resistance, comprising:

a substrate, having an active region and a gate metal region, the substrate in the active region having at least a gate bus trench and a plurality of cell trenches, wherein the gate bus trench extends to the gate metal region, and the cell trenches and the gate bus trench are connected to each other;

at least a trench transistor, disposed in the active region of the substrate and at a side of the gate bus trench;

a conductive layer and a metal contact plug, disposed in the gate bus trench;

an insulating layer and an interlayer dielectric disposed on the substrate, wherein the insulating layer completely covers the metal contact plug in the active region, the insulating layer covers a portion of the gate metal region to expose a portion of the metal contact plug in the gate metal region, and the interlayer dielectric covers the conductive layer; and a patterned metal layer disposed on the interlayer dielectric and the insulating layer, wherein the patterned metal layer comprises a gate metal layer and a source metal layer respectively disposed on the gate metal region and the active region, the gate metal layer is electrically connected to the metal contact plug for being configured to provide a gate voltage, and the source metal layer covers the insulating layer and is electrically connected to the trench transistor for being configured to provide a source voltage.

2. The power semiconductor device of claim 1, wherein the conductive layer is also disposed in the cell trenches.

3. The power semiconductor device of claim 2, further comprising a gate insulating layer disposed on a surface of the gate bus trench and the cell trenches, wherein the gate insulating layer is configured to isolate the conductive layer from the substrate.

4. The power semiconductor device of claim 1, further comprising at least a source contact plug disposed between two adjacent cell trenches, wherein the source contact plug is electrically connected to the source metal layer.

5. The power semiconductor device of claim 1, further comprising a drain metal layer disposed on a surface of the substrate opposite to the patterned metal layer.

6. The power semiconductor device of claim 1, wherein the conductive layer comprises doped polysilicon, and the metal contact plug comprises tungsten.

* * * * *